US005882725A

United States Patent [19]
Radford

[11] Patent Number: 5,882,725
[45] Date of Patent: Mar. 16, 1999

[54] PARYLENE DEPOSITION CHAMBER INCLUDING ECCENTRIC PART TUMBLER

[75] Inventor: Peter J. Radford, San Clemente, Calif.

[73] Assignee: Para Tech Coating, Inc., Aliso Viejo, Calif.

[21] Appl. No.: 887,107

[22] Filed: Jul. 1, 1997

[51] Int. Cl.[6] .......... C23C 16/00

[52] U.S. Cl. .......... 427/212; 427/255.5; 427/255.6; 118/715; 118/716

[58] Field of Search .......... 118/716, 715; 427/212, 255.5, 255.6

[56] References Cited

U.S. PATENT DOCUMENTS

| | | | |
|---|---|---|---|
| 2,161,950 | 6/1939 | Christensen | 118/716 |
| 3,288,728 | 11/1966 | Gorham | 260/2 |
| 3,300,332 | 1/1967 | Gorham et al. | 117/100 |
| 3,342,754 | 9/1967 | Gorham | 260/2 |
| 3,472,795 | 10/1969 | Tittmann et al. | 260/2 |
| 3,503,903 | 3/1970 | Shaw et al. | 260/2 |
| 3,517,644 | 6/1970 | Baer | 118/716 |
| 3,600,216 | 8/1971 | Stewart | 117/72 |
| 3,719,166 | 3/1973 | Gereth | 118/18 |
| 3,753,773 | 8/1973 | Lee | 117/161 |
| 3,895,135 | 7/1975 | Hofer | 427/428 |
| 3,908,046 | 9/1975 | Fitzpatrick et al. | 427/216 |
| 4,397,885 | 8/1983 | Akai | 118/716 |
| 4,508,054 | 4/1985 | Baumberger et al. | 118/718 |
| 4,508,760 | 4/1985 | Olson | 118/716 |
| 4,649,859 | 3/1987 | Wanlass | 118/715 |
| 4,683,143 | 7/1987 | Riley | 427/8 |
| 4,945,856 | 8/1990 | Stewart | 118/715 |
| 5,078,091 | 1/1992 | Stewart | 118/719 |
| 5,167,718 | 12/1992 | Stewart | 118/729 |
| 5,268,033 | 12/1993 | Stewart | 118/719 |

FOREIGN PATENT DOCUMENTS

| | | |
|---|---|---|
| 53-11576 | 2/1978 | Japan . |
| 58-166726 | 10/1983 | Japan . |
| 59-74629 | 4/1984 | Japan . |

*Primary Examiner*—Richard Bueker
*Attorney, Agent, or Firm*—Stetina Brunda Garred & Brucker

[57] ABSTRACT

A deposition chamber for use in depositing vapors on substrates. The deposition chamber comprises a hollow outer containment vessel which defines a first longitudinal axis. Rotatably mounted within the containment vessel is a tumbler having first and second ends and an interior compartment for accommodating the substrates. The tumbler defines a second longitudinal axis which is angularly off-set relative to the first longitudinal axis. Disposed within the tumbler are vapor inlet and outlet ports, both of which communicate with the interior compartment. The rotation of the tumbler facilitates the reciprocal movement of substrates positioned within the interior compartment between the first and second ends of the tumbler.

23 Claims, 2 Drawing Sheets

14
10
12
16
20
38
52
32
42
21
82
88
23
25
2
40
24
26
18
28
27
22

36
34
76
W
44
50
62
58
56
63
84
66
64
86
72
102
106
67
108
100
30
A1
70
104
74
A2
54
W'
65
60
31
88
80
48
23
40
46
27
25

76
80
62
52
58
65
76
56
W
67
67
74
66
72
100
60
74
104
80

12
32
100
60
52

PARYLENE DEPOSITION CHAMBER INCLUDING ECCENTRIC PART TUMBLER

FIELD OF THE INVENTION

The present invention relates generally to a system for depositing condensation coatings on various substrates, and more particularly to an improved modular deposition chamber which includes an eccentric tumbler for facilitating the uniform deposition of para-xylylene polymers on substrates therewithin.

BACKGROUND OF THE INVENTION

Para-xylylene polymers are employed as coatings for various electronic components due to their desirable physical and electrical properties. One advantage of poly-para-xylylene coatings is that thin layers of such coatings are capable of exhibiting highly desirable physical and electrical properties. Because para-xylylene coatings are applied in very thin layers, heat tends to dissipate rapidly from the underlying components. Thus, the coated components cool down quickly and are less prone to temperature related degradation than similar components bearing other types of coatings.

In further contrast to conventional polymer coatings, para-xylylenes are generally not prepolymerized prior to application on the coatable substrates. This is because the para-xylylene polymers are not given to simple extrusion, melting or molding as are many of the conventional thermoplastics. Additionally, because the para-xylylenes are generally insoluble in commonly used organic solvents, it is impractical to employ traditional solvent deposition techniques for applying poly-para-xylylene coatings.

Accordingly, in most commercial applications, para-xylylene polymers are deposited on desired substrates by a pyrolytic deposition process known specifically as the "parylene process." Such process begins with the vaporization of a cyclic di-para-xylylene dimer. The dimer is pyrolytically cleaved at temperatures of about 400° to 750° C. to form a reactive para-xylylene monomer vapor. Thereafter, the reactive monomer vapor is transferred to a deposition chamber wherein the desired substrates are located. Within the deposition chamber, the reactive monomer vapor condenses upon the desired substrates to form a para-xylylene polymer or co-polymer film.

Any monomer vapor which fails to condense within the deposition chamber is subsequently removed by a cold trap which is maintained at approximately −70° C.

The entire parylene process is generally carried out in a closed system under constant negative pressure. Such closed system may incorporate separate chambers for the (a) vaporization, (b) pyrolysis, and (c) deposition steps of the process, with such chambers being connected by way of appropriate plumbing or tubular connections.

A primary consideration in the parylene deposition process is the achievement of uniform coating thickness on the desired substrates. Unlike conventional polymer coating systems, the condensation deposition of parylene coatings is capable of depositing even ultra-thin films without running or uneven areas resulting upon the substrates, provided that the monomer vapor is homogeneously and evenly distributed on the surface of the substrate. Thus, the design and functioning of the deposition chamber is critical to the achievement of uniform vapor distribution with resultant even coating deposition. Another important consideration in the parylene deposition process is the minimization of waste. Because of the high costs associated with parylene raw materials, there exists substantial economic motivation to preserve and conserve the parylene materials during the coating process.

The parylene deposition process is conducted most efficiently when a relatively large number of substrates are simultaneously coated. However, parylene deposition chambers employed in the prior art are generally deficient in that they provide less than optimal coating uniformity due to an inferior distribution of substrates within the deposition chamber. In this respect, when large numbers of substrates are disposed within the deposition chamber, certain ones of the substrates often contact each other and/or portions of the inner wall of the deposition chamber. Since the substrates in the prior art deposition chambers are not tumbled or otherwise shifted during the deposition process, the coating is not applied to those surfaces of the substrates which are in contact with another substrate or the deposition chamber wall. The present invention overcomes this deficiency associated with prior art deposition chambers by providing a deposition chamber including an internal eccentric tumbler for facilitating the uniform and complete deposition of monomer vapor upon the substrates therewithin.

SUMMARY OF THE INVENTION

In accordance with the present invention, there is provided a deposition chamber for use in depositing vapors on substrates. The deposition chamber comprises a hollow outer containment vessel which defines a first longitudinal axis. The containment vessel itself comprises a cylindrically configured housing having opposed ends and an inner surface. Rigidly attached to one end of the housing is a first end wall, while removably attached to the opposite end of the housing is a second end wall.

In addition to the containment vessel, the deposition chamber comprises an eccentric tumbler which is rotatably mounted within the containment vessel. The tumbler includes first and second ends, and an interior compartment which accommodates the substrates. Additionally, the tumbler defines a second longitudinal axis which is angularly off-set relative to the first longitudinal axis when the tumbler is inserted into the containment vessel. In this respect, the removal of the second end wall from the housing allows the tumbler to be inserted into and removed from within the hollow interior of the containment vessel. Disposed within the tumbler are vapor inlet and outlet ports, each of which communicates with the interior compartment. Due to the second longitudinal axis being off-set relative to the first longitudinal axis, the rotation of the tumbler facilitates the reciprocal movement of the substrates positioned within the interior compartment between the first and second ends of the tumbler. Such reciprocal movement promotes the even coating of monomer vapor upon the substrates. The tumbler preferably rotates at a speed in the range of approximately 1 to 50 RPM's.

In the preferred embodiment, the tumbler itself comprises a cylindrically configured sidewall. Enclosing one end of the sidewall is a first end plate, while enclosing the opposite end of the sidewall is a second end plate. The sidewall and the first and second end plates collectively define the interior compartment of the tumbler. The vapor inlet port is preferably disposed within the first end plate, with the vapor outlet port preferably being disposed within the second end plate. The tumbler further comprises a pair of bearing members or plates which are attached to respective ends of the sidewall. The first and second end plates are removably attached to respective ones of the bearing members for facilitating the loading and unloading of the interior compartment with the substrates. When the tumbler is inserted into the containment vessel, the peripheral edges of the bearing members are in movable engagement with the inner surface of the housing, thus facilitating the rotatable mounting of the tumbler within the containment vessel.

In the preferred embodiment of the present invention, the deposition chamber is used in combination with a vapor inlet line which extends through the first end wall of the containment vessel. The vapor inlet line is inserted into the vapor inlet port and communicates with the interior compartment. In addition to the vapor inlet line, the deposition chamber is used in combination with a vapor outlet line which is fluidly connected to the housing and communicates with the vapor outlet port via an opening disposed within the bearing member having the second end plate attached thereto. Mechanically coupled to the tumbler, and in particular to the second end plate thereof, is a motor which, when activated, rotates the tumbler and thus facilitates the reciprocal movement of the substrates within the interior component.

Further in accordance with the present invention, there is provided a method of depositing vapors on substrates. The method comprises the initial step of providing a deposition chamber which includes a containment vessel defining a first longitudinal axis, and a tumbler rotatably mounted within the containment vessel and defining a second longitudinal axis which is angularly off-set relative to the first longitudinal axis. The preferred method further comprises the step of loading the substrates into the interior compartment of the tumbler, and thereafter circulating vapors through the interior compartment. The tumbler is then rotated such that the substrates reciprocally move within the interior compartment thereof. The step of circulating the vapors through the interior compartment is preferably accomplished through the use of vapor inlet and outlet ports which communicate therewith. Additionally, the step of rotating the tumbler is preferably accomplished through the use of a motor mechanically coupled thereto.

BRIEF DESCRIPTION OF THE DRAWINGS

These, as well as other features of the present invention, will become more apparent upon reference to the drawings wherein.

DETAILED DESCRIPTION OF THE PREFERRED EMBODIMENT

Figures 1, 2:
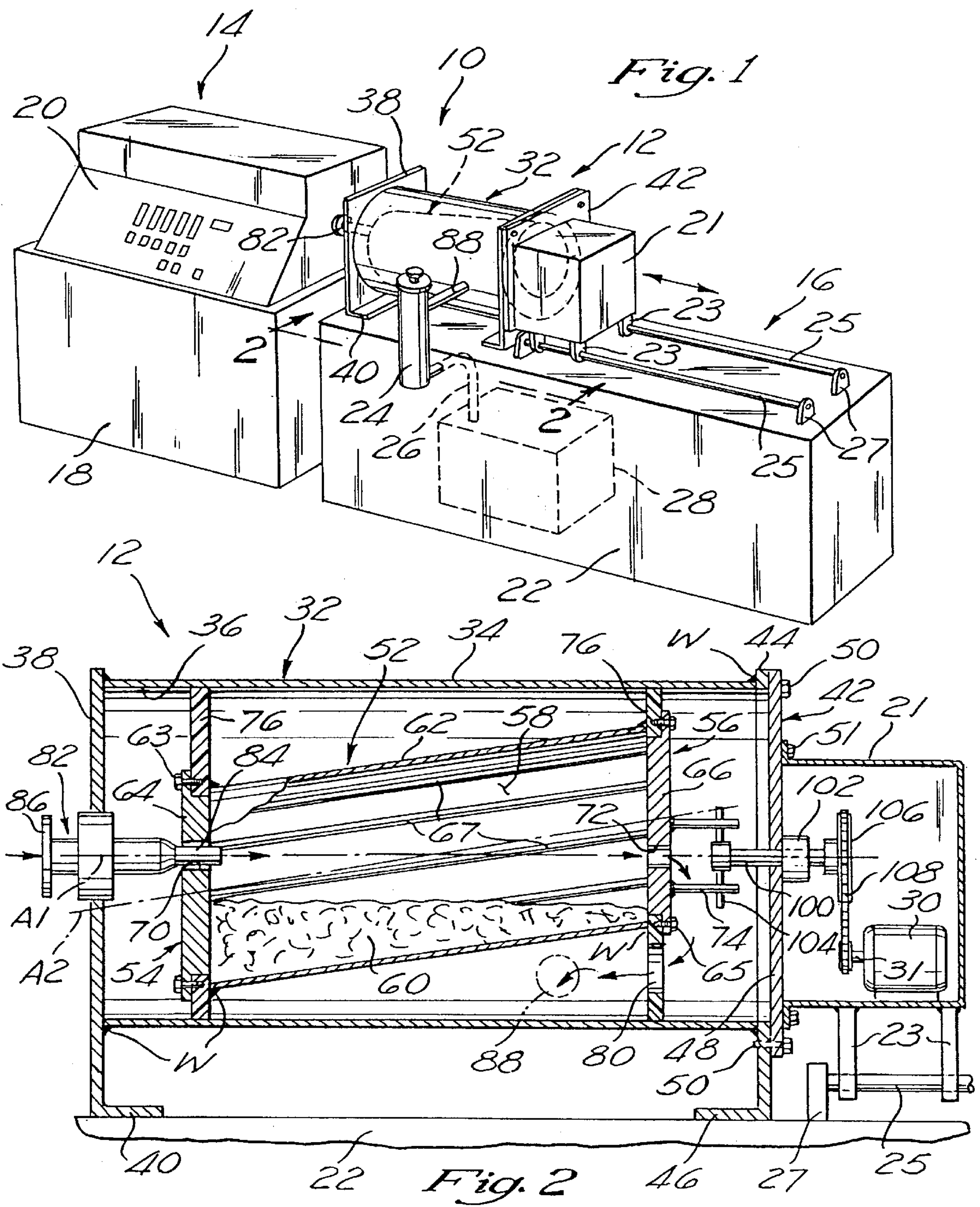
FIG. 1 is a perspective view of a parylene deposition system including the deposition chamber constructed in accordance with the present invention.
FIG. 2 a cross-sectional view taken along line 2—2 of FIG. 1.

Referring now to the drawings wherein the showings are for purposes of illustrating a preferred embodiment of the present invention only, and not for purposes of limiting the same, FIG. 1 perspectively illustrates a parylene deposition system 10 which includes the new and unique deposition chamber 12 constructed in accordance with the present invention. As seen in FIG. 1, the deposition system 10 is preferably of modular design, and includes a pyrolytic vapor generating module 14 and an attendant deposition chamber module 16. The pyrolytic vapor generating module 14 comprises a cabinet-like enclosure 18 which includes a control panel 20.

Disposed within the enclosure 18 of the vapor generating module 14 is a dimer vaporization chamber (not shown) into which parylene raw material is inserted via an associated entrance port. The vaporization chamber includes heating elements associated therewith, and provides a zone wherein a quantity of di-para-xylylene dimer is initially vaporized at elevated temperatures. Also disposed within the enclosure 18 is a pyrolysis chamber or pyrolizer (not shown) which is fluidly coupled to the vaporization chamber by appropriate tubular connections. The vaporized dimer exits the vaporization chamber and enters the pyrolizer wherein the dimer is pyrolyzed at temperatures of about 400° to 750° C. by heating elements associated with the pyrolizer so as to form the desired para-xylylene monomer vapor. Though also not shown, the vapor generating module 14 further houses a controller unit which controls the temperatures, conditions, valves, motors, pumps, etc., of the deposition system 10.

The deposition chamber module 16 of the deposition system 10 itself comprises a base cabinet 22 to which the deposition chamber 12 is mounted. The deposition chamber module 16 further comprises a cold trap 24 which is fluidly coupled to the deposition chamber 12 by appropriate tubular connections which will be described in more detail below. The cold trap 24 may be attached to or disposed within the base cabinet 22. Fluidly coupled to the cold trap 24 via a tubular connection 26 is a vacuum pump 28 which may also be attached to or disposed within the base cabinet 22. The vacuum pump 28 is used to maintain negative pressure within the deposition system 10 as will described in more detail below. Though not shown, preferably disposed within the tubular connection 26 between the cold trap 24 and vacuum pump 28 is filter.

As shown in FIGS. 1 and 2, the deposition chamber 12 includes a box-like motor housing 21 which is disposed on one end thereof and includes a motor 30 mounted therewithin. The motor housing 21 includes two pairs of linear bearings 23 which are rigidly attached to the bottom thereof in opposed relation to each other. Each pair of the linear bearings 23 is slidably positioned upon a respective one of a pair of guide rods or rails 25 which are attached to the top surface of the base cabinet 22 via opposed pairs of mounts 27 so as to extend in spaced, generally parallel relation to each other. The attachment of the linear bearings 23 to the motor housing 21 is preferably accomplished through the use of welds, though alternative attachment methods may be employed in the deposition chamber 12. The motor 30 is used to facilitate the rotation of an eccentric component of the deposition chamber 12, as will also be described in more detail below.

Figures 3, 4:
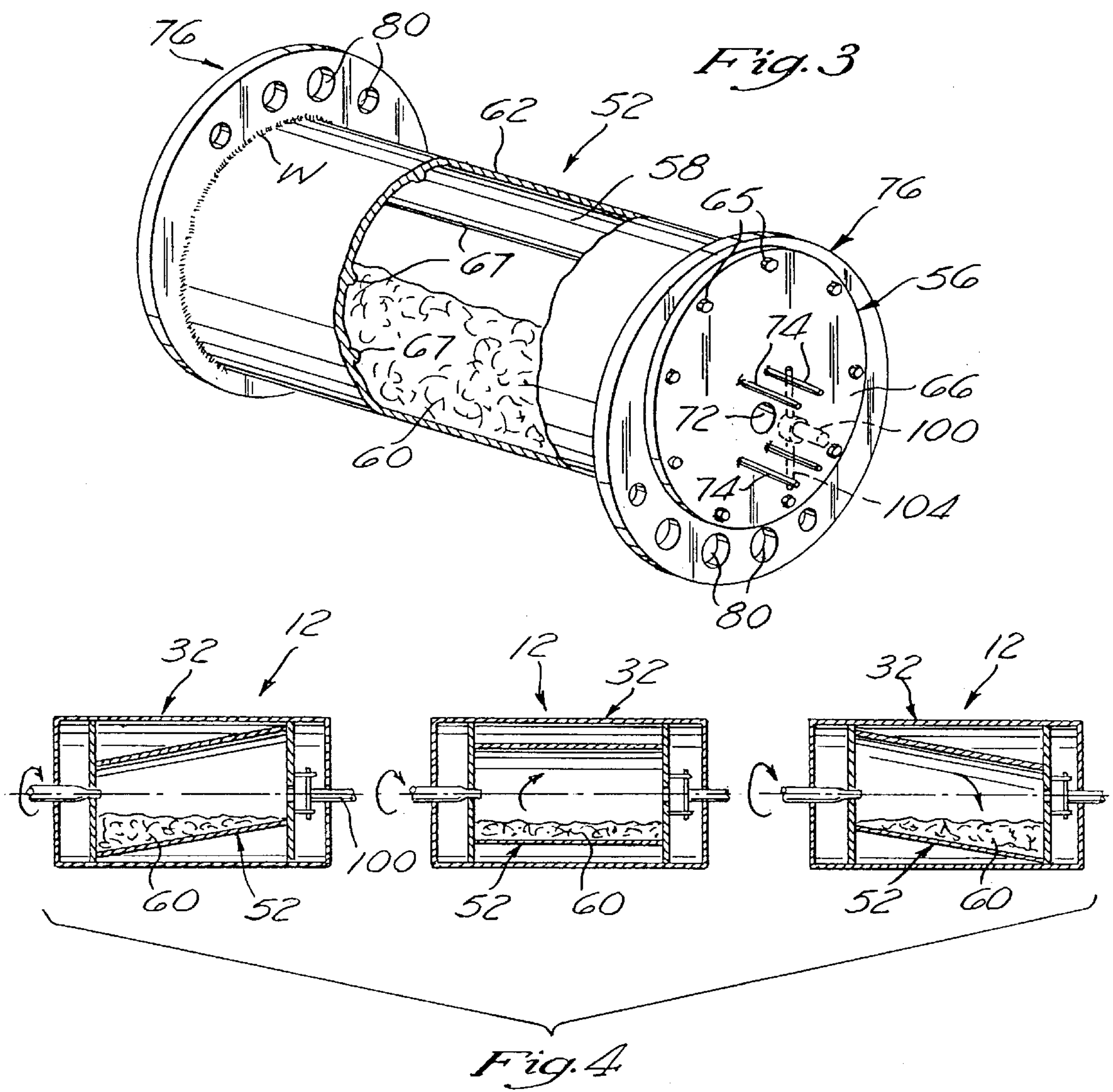
FIG. 3 is a perspective view of the tumbler of the deposition chamber constructed in accordance with the present invention.
FIG. 4 is a cross-sectional view illustrating the manner in which substrates are reciprocally moved within the rotating tumbler of the deposition chamber constructed in accordance with the present invention.

Referring now to FIGS. 2 and 3, the deposition chamber 12 of the present invention which is mounted to the base cabinet 22 of the deposition chamber module 16 is used to facilitate the deposition or coating of the monomer vapor upon substrates disposed therewithin. The deposition chamber 12 comprises a stationary, hollow outer containment vessel 32 which defines a first longitudinal axis A1. The containment vessel 32 itself comprises a cylindrically configured housing 34 which defines a generally smooth inner surface 36. Rigidly attached to one end of the housing 34 via a weld W is a first end wall 38 which includes a lower, laterally extending flange portion 40. Attached to the opposite end of the housing 34 is a second end wall 42. The second end wall 42 itself comprises a rim member 44 which is rigidly attached to the housing 34 via a weld W. The rim member 44, like the first end wall 38, includes a lower, laterally extending flange portion 46. The second end wall 42 further comprises a cover plate 48 which is removably attached to the rim member 44 via fasteners 50 such as bolts. As seen in FIG. 2, the motor housing 21 is itself attached to the outer surface of the cover plate 44 via fasteners 51 such as bolts. The detachment of the cover plate 48 from the rim member 44 provides access to the hollow interior of the containment vessel 32 for reasons which will be described in more detail below. As seen in FIGS. 1 and 2, the flange portions 40, 46 of the first and second end walls 38, 42 are used to facilitate the mounting of the containment vessel 32 to the top of the base cabinet 22 of the deposition chamber module 16.

In addition to the containment vessel 32, the deposition chamber 12 comprises an eccentric tumbler 52 which is rotatably mounted within the interior of the containment vessel 32. The tumbler 52 defines a first end 54, a second end 56, and an interior compartment 58 which accommodates a plurality of substrates 60 to be coated within the parylene deposition system 10. The tumbler 52 further defines a second longitudinal axis A2 which is angularly off-set relative to the first longitudinal axis A1 when the tumbler 52 is inserted into the containment vessel 32.

In the preferred embodiment, the tumbler 52 comprises a cylindrically configured sidewall 62. Rigidly attached to respective ones of the opposed ends of the sidewall 62 is a pair of circularly configured bearing members or plates 76, each of which defines a peripheral edge. The attachment of the bearing members 76 to respective ones of the opposed ends of the sidewall 62 of the tumbler 52 is preferably facilitated through the use of welds W, though alternative attachment methods may also be employed in the deposition chamber 12. The overall diameter of each bearing member 76 is substantially equal to the diameter of the inner surface 36 of the housing 34 of the containment vessel 32. Each of the bearing members 76 is preferably provided with a series of apertures or openings 80 disposed therein for reducing the weight thereof, and hence the overall weight of the tumbler 52. The openings 80 within the bearing member 76 disposed adjacent the second end 56 of the tumbler 52 are also used to provide a vapor flow path as will be discussed in more detail below.

The tumbler 52 of the deposition chamber 12 further comprises a first end plate 64 which defines the first end 54 of the tumbler 52 and is removably attached to the adjacent bearing member 76 via fasteners 63 such as bolts. Removably attached to the other bearing member 76 via fasteners 65 such as bolts is a second end plate 66 which defines the second end 56 of the tumbler 52. The first and second end plates 64, 66 are identically configured, with the removable attachment of the first and second end plates 64, 66 to respective ones of the bearing members 76 via the fasteners 63, 65 facilitating the loading and unloading of the interior compartment 58 with the substrates 60. As will be recognized, the inner surfaces of the sidewall 62 and first and second end plates 64, 66 collectively define the interior compartment 58 of the tumbler 52. Formed on the inner surface of the sidewall 62 in equidistantly spaced relation to each other are a plurality of elongate ribs 67 which extend longitudinally between the first and second end plates 64, 66 in generally parallel relation to the second longitudinal axis A2. As further seen in FIG. 2, the first and second end plates 64, 66, in addition to extending in generally parallel relation to each other, also extend in generally parallel relation to the first and second end walls 38, 42 of the containment vessel 32.

Disposed within the first end plate 64 of the tumbler 52 is a vapor inlet port 70, while disposed within the second end plate 66 is a vapor outlet port 72. Both the vapor inlet port 70 and vapor outlet port 72 fluidly communicate with the interior compartment 58. Additionally, the vapor inlet and outlet ports 70, 72 are oriented within respective ones of the first and second end plates 64, 66 so as to extend along the first longitudinal axis A1 when the tumbler 52 is mounted within the containment vessel 32, rather than extending along the second longitudinal axis A2.

As best seen in FIGS. 2 and 3, attached to the outer surface of the second end plate 66 and extending perpendicularly therefrom are two opposed pairs of elongate drive pins 74. The two pairs of drive pins 74 are disposed on opposite sides of and equidistantly spaced from the vapor outlet port 72 such that the drive pins 74 of both pairs generally define respective ones of the four corner regions of a rectangularly configured region. The drive pins 74 are used to facilitate the mechanical coupling of the tumbler 52 to the motor 30 mounted within the motor housing 21. Such coupling is facilitated by a drive shaft 100 which extends through and is rotatably mounted within the second end wall 42 of the containment vessel 32, and more particularly the cover plate 48 thereof. The rotatable mounting of the drive shaft 100 within the cover plate 48 is aided by a drive shaft seal 102 mounted to the outer surface of the cover plate 48. Extending perpendicularly from the end of the drive shaft 100 disposed within the interior of the containment vessel 32 is a coupling pin 104, the opposed ends of which extend between respective pairs of the drive pins 74 in the manner shown in phantom in FIG. 3. The structure formed by the combination of the drive shaft 100 and coupling pin 104 has a generally T-shaped configuration as seen in FIG. 2. Attached to the end of the drive shaft 100 protruding from the containment vessel 32 and the drive shaft seal 102 is a coupling 106 which is mechanically engaged to the output shaft 31 of the motor 30 via a chain 108. As will be recognized, due to the extension of the coupling pin 44 between each pair of drive pins 74, the rotation of drive shaft 100 via the motor 30 facilitates the concurrent rotation of the tumbler 52. The drive shaft seal 102 allows the drive shaft 100, and hence the coupling pin 104 and coupling 106 disposed on the opposed ends thereof, to rotate relative to the containment vessel 32. Importantly, the drive shaft 100 is oriented within the cover plate 48 of the containment vessel 32 so as to extend along the first longitudinal axis A1.

As will be recognized, the bearing members 76 facilitate the rotatable mounting of the tumbler 52 within the containment vessel 32. In this respect, when the tumbler 52 is inserted into the hollow interior of the containment vessel 32, the peripheral edges of the bearing members 76 are in slidable engagement with the inner surface 36 of the housing 34, thus allowing the tumbler 52 to be easily rotated within the containment vessel 32 by the motor 30. The bearing members 76 are preferably constructed of low friction plastic, such as ultra high density polyethylene to minimize frictional resistance to rotation. The insertion of the tumbler 52 into the containment vessel 32 and the removal of the tumbler 52 from therewithin is facilitated by the selective detachment of the cover plate 48 of the second end wall 42 from the rim member 44 thereof. In this respect, subsequent to the removal of the fasteners 50, the motor housing 21 (which is attached to the cover plate 48 via the fasteners 51) is slid along the guide rails 25 via the linear bearings 23 away from the housing 34 of the containment vessel 32. Such movement causes the cover plate 48 to be separated from the rim member 44 due to the attachment of the cover plate 48 to the motor housing 21, and further causes the coupling pin 104 to be removed from between the drive pins 74 due to the drive shaft 100 being rotatably mounted within the cover plate 48. The movement of the motor housing 21 to the distal ends of the guide rails 25 (i.e., the outermost mounts 27) provides sufficient space for the tumbler to be removed from within and re-inserted into the interior of the housing 34 of the containment vessel 32.

As previously indicated, subsequent to the removal of the tumbler 52 from within the containment vessel 32 in the aforementioned manner, access to the interior compartment 58 thereof is facilitated by the removal of either the first or second end plates 64, 66 from a respective one of the bearing members 76. Such removal allows the substrates 60 to be loaded into and removed from within the interior compartment 58. Subsequent to the tumbler 52 being reinserted inserted into the interior of the containment vessel 32, the re-attachment of the cover plate 48 to the rim member 44 to enclose the containment vessel 32 is accomplished in the reverse order of the previously described detachment process. In this respect, the motor housing 21 is slid along the guide rails 25 until such time as the coupling pin 104 is re-inserted between the pairs of drive pins 74, and the cover plate 48 is abutted against the rim member 44. Thereafter, the fasteners 50 are used to re-attach the cover plate 48 to the rim member 44, thus facilitating the re-assembly of the second end wall 42 and the enclosure of the interior of the containment vessel 32. As will be recognized, the motor 30, cover plate 48, drive shaft 100, drive shaft seal 102, coupling pin 104, coupling 106 and chain 108 all move as a unit with the motor housing 21 along the guide rails 25.

As best seen in FIG. 2, the deposition chamber 12 of the present invention is preferably used in combination with a tubular vapor inlet line 82 which extends through and is mounted within the first end wall 38 of the containment vessel 32. The vapor inlet line 82 defines a reduced diameter, nozzle-like inner end 84 which is inserted into the vapor inlet port 70 of the first end plate 64 and extends therethrough such that the vapor inlet line 82 communicates with the interior compartment 58 of the tumbler 52. The end of the vapor inlet line 82 opposite the inner end 84 includes a circularly configured connector flange 86 extending radially therefrom. The vapor inlet line 82 is mounted within the first end wall 38 so as to extend along the first longitudinal axis A1, thus causing the inner end 84 to be coaxially aligned with the vapor inlet port 70.

In the preferred embodiment, the tumbler 52 is rotatable relative to the vapor inlet line 82 which is maintained in fixed relation to the first end wall 38 of the containment vessel 32. In this respect, the insertion of the tumbler 52 into the interior of the containment vessel 32 is limited by the abutment of the first end plate 64 against the beveled shoulder defined between the inner end 84 of the vapor inlet line 82 and the remainder thereof. When the tumbler 52 is fully inserted into the interior of the containment vessel 32, the inner end 84 of the vapor inlet line 82 is extended through the vapor inlet port 70 in the aforementioned manner, so as to communicate with the interior compartment 58 of the tumbler 52.

The deposition chamber 12 is also preferably used in combination with a tubular vapor outlet line 88 which communicates with the housing 34 of the containment vessel 32 and fluidly couples the interior of the containment vessel 32 to the cold trap 24. The vapor outlet port 72 disposed within the second end plate 66 of the tumbler 52 communicates directly with the interior of the containment vessel 32. As seen in FIG. 1, the vapor inlet line 82, and in particular the connector flange 86 thereof, is connected to an inlet line 90 extending from the pyrolytic vapor generating module 14 of the parylene deposition system 10.

In the use of the parylene deposition system 10, the substrates 60 are initially loaded into the interior compartment 58 of the tumbler 52 by detaching the first end plate 64 or the second end plate 66 from a respective bearing member 76. Subsequent to the interior compartment 58 being loaded with the substrates 60 and the first end plate 64 or second end plate 66 being re-attached to the bearing member 76, the tumbler 52 is inserted into the interior of the containment vessel 32. Access to the interior of the containment vessel 32 is facilitated by the removal of the cover plate 48 from the rim member 44 of the second end wall 42 by sliding the motor housing 21 along the guide rails 25 in the previously described manner. The tumbler 52 is inserted into the interior of the containment vessel 32 such that the inner end 84 of the vapor inlet line 82 is received into vapor inlet port 70. Such connection is facilitated simply by sliding the tumbler 52 longitudinally within the interior of the containment vessel 32 due to the vapor inlet line 82 and vapor inlet port 70 being coaxially aligned with each other along the first longitudinal axis A1. When the inner end 84 is received into the vapor inlet port 70 in the aforementioned manner, the peripheral edges of the bearing members 76 are in sliding contact with the inner surface 36 of the housing 34. After the tumbler 52 has been inserted into the interior of the containment vessel 32, the cover plate 48 is re-attached to the rim member 44 in the previously described manner, thus facilitating the enclosure of the interior of the containment vessel 32. As previously explained, the re-attachment of the cover plate 48 to the rim member 44 results in the re-insertion of the coupling pin 104 of the drive shaft 102 between the two pairs of drive pins 74 of the tumbler 52.

After the tumbler 52 has been properly mounted within the containment vessel 32, a quantity of parylene dimer is introduced into the vaporization chamber of the pyrolytic vapor generating module 14 via its entrance port. After such introduction has occurred, the deposition process is initiated by activating the heating elements associated with the pyrolizer, the motor 30, and the vacuum pump 28. The heating elements of the pyrolizer are set to an operating temperature of approximately 400° to 700° C., and preferably about 600° C. When the set temperature of the heating elements of the pyrolizer has been reached and the required vacuum has been achieved by the vacuum pump 28, the heating elements of the vaporization chamber are activated to start the process of sublimation of the dimer.

The activation of the vacuum pump 28 creates a negative system pressure which causes the parylene material to be drawn from the vaporization chamber into the pyrolizer via the tubular connections therebetween. As the vaporized dimer enters the pyrolizer, the heat provided by the heating elements associated therewith causes the dimer to be further pyrolyzed to form the desired para-xylylene-monomer. The vacuum created by the vacuum pump 28 causes the parylene vapor to be drawn into the interior compartment 58 of the tumbler 52 via the inlet line 90 and vapor inlet line 82. The vapor flows (i.e., circulates) through the interior compartment 58, and deposits upon the substrates 60 disposed therewithin.

As the monomer vapor is circulated through the interior compartment 58, the tumbler 52 is rotated within the containment vessel 32 in the aforementioned manner via the activation of the motor 30. In the preferred embodiment, the motor 30 is adapted to rotate the tumbler 52 at a speed in the range of approximately 1 to 50 revolutions per minute. Importantly, due to the second longitudinal axis A2 of the tumbler 52 being angularly off-set relative to the first longitudinal axis A1 of the containment vessel 32, the rotation of the tumbler 52 causes the same to gyrate back and forth, thereby resulting in the reciprocal movement of the substrates 60 between the first and second end plates 64, 66 in the manner shown in FIG. 4. The movement of the substrates 60 is aided by the ribs 67 disposed on the inner surface of the sidewall 62. The reciprocal movement of the substrates 60 within the interior compartment 58 as the monomer vapor circulates therethrough promotes the even and complete coating of the substrates 60 with the vapor.

Any residual vapor not being deposited on the substrates 60 within the interior compartment 58 exits the tumbler 52 via the vapor outlet port 72. The vapor flows through the vapor outlet port 72 and into the enclosed interior of the containment vessel 32, and is subsequently drawn into the vapor outlet line 88 via the openings 80 disposed within the bearing member 76 having the second end plate 66 attached thereto. As seen in FIG. 2, the vapor outlet line 88 is oriented in relative close proximity to this bearing member 76 of the tumbler 52. After passing through the outlet line 88, the vapor enters and circulates through the interior reservoir of the cold trap 24. The flow through the cold trap 24 causes the condensation and polymerization of residual vapors which were not coated upon the substrates 60 disposed within the interior compartment 58 of the tumbler 52. The vapor is then drawn from within the interior reservoir of the cold trap 24 through the tubular connection 26 and into the filter therewithin wherein any remaining vapor is removed from the air stream. In this respect, the filter prevents any parylene from condensing within the vacuum pump 28. Thereafter, the air stream is circulated through the vacuum pump 28 and subsequently vented to the exterior of the deposition chamber module 16.

Additional modifications and improvements of the present invention may also be apparent to those of ordinary skill in the art. Thus, the particular combination of parts described and illustrated herein is intended to represent only one embodiment of the present invention, and is not intended to serve as limitations of alternative devices within the spirit and scope of the invention.

What is claimed is:

1. A deposition chamber for use in depositing vapors on substrates, comprising:

- a hollow outer containment vessel defining a first longitudinal axis;
- a tumbler rotatably mounted within the containment vessel and having opposed first and second ends and an interior compartment for accommodating the substrates, said tumbler defining a second longitudinal axis which is angularly off-set relative to the first longitudinal axis;
- a vapor inlet port disposed within the first end of the tumbler and communicating with the interior compartment;
- a vapor outlet port disposed within the second end of the tumbler and communicating with the interior compartment; and
- a vapor inlet line inserted into the vapor inlet port and communicating with the interior compartment;
- the vapor inlet line and the vapor outlet port being oriented such that vapors are with the rotation of the tumbler facilitating the reciprocal movement of the substrates positioned within the interior compartment between the first and second ends of the tumbler.

2. The deposition chamber of claim 1 wherein said tumbler comprises:

- a sidewall having opposed ends;
- a first end plate enclosing one end of the sidewall and defining the first end of the tumbler, the vapor inlet port being disposed within the first end plate; and
- a second end plate enclosing the other end of the sidewall and defining the second end of the tumbler, the vapor outlet port being disposed within the second end plate;
- said sidewall and said first and second end plates collectively defining the interior compartment of the tumbler.

3. The deposition chamber of claim 2 wherein the sidewall has a generally cylindrical configuration.

4. The deposition chamber of claim 2 wherein said containment vessel comprises:

- a housing having opposed ends and an inner surface;
- a first end wall attached to one end of the housing, the vapor inlet line extending through and being rotatable within the first end wall; and
- a second end wall removably attached to the other end of the housing for allowing the tumbler to be inserted into and removed from within the containment vessel.

5. The deposition chamber of claim 4 wherein said housing has a generally cylindrical configuration.

6. The deposition chamber of claim 4 wherein said tumbler further comprises at least one bearing member attached to the sidewall and in movable engagement with the inner surface of the housing when the tumbler is inserted into the containment vessel, said bearing member facilitating the rotatable mounting of the tumbler within the containment vessel.

7. The deposition chamber of claim 6 wherein said tumbler comprises a pair of bearing members attached to respective ends of the sidewalls.

8. The deposition chamber of claim 7 wherein the first and second end plates are removably attached to respective ones of the bearing members for facilitating the loading and unloading of the interior compartment with the substrates.

9. The deposition chamber of claim 6 further in combination with:

- a vapor outlet line fluidly connected to the housing and communicating with the vapor outlet port; and
- a motor mechanically coupled to the tumbler;
- the rotation of the tumbler via the motor facilitating the reciprocal movement of the substrates within the interior compartment.

10. The deposition chamber of claim 9 wherein the motor is adapted to rotate the tumbler at a speed in the range of approximately 1 to 50 RPM's.

11. The deposition chamber of claim 9 wherein the bearing member includes at least one opening disposed therein for facilitating the flow of vapors from the vapor outlet port into the vapor outlet line.

12. A method of depositing vapors on substrates, comprising the steps of:

(a) providing a deposition chamber which includes:

- a containment vessel defining a first longitudinal axis;
- a tumbler rotatably mounted within the containment vessel and having opposed first and second ends and an interior compartment for accommodating the substrates, the tumbler defining a second longitudinal axis which is angularly off-set relative to the first longitudinal axis;

a vapor inlet port disposed within the first end of the tumbler and communicating with the interior compartment;

a vapor outlet port disposed within the second end of the tumbler and communicating with the interior compartment; and a vapor inlet line inserted into the vapor inlet port and communicating with the interior compartment such that vapors are infected directly thereinto along the first longitudinal axis;

(b) loading the substrates into the interior compartment of the tumbler;

(c) circulating vapors through the interior compartment of the tumbler via the vapor inlet line and the vapor outlet port; and (d) rotating the tumbler such that the substrates reciprocally move within the interior compartment.

13. The method of claim 12 wherein step (d) comprises rotating the tumbler via a motor mechanically coupled thereto.

14. The method of claim 12 wherein step (d) comprises rotating the tumbler at a speed in the range of approximately 1 to 50 RPM's.

15. A deposition chamber for use in depositing vapors on substrates, comprising:

a hollow outer containment vessel defining a first longitudinal axis and including a housing having opposed ends and an inner surface, a first end wall attached to one end of the housing, and a second end wall removably attached to the other end of the housing;

a tumbler rotatably mounted within the containment vessel and defining a second longitudinal axis which is angularly off-set relative to the first longitudinal axis, the tumbler including a sidewall having opposed ends, a first end plate enclosing one end of the sidewall and defining a first end of the tumbler, a second end plate enclosing the other end of the sidewall and defining a second end of the tumbler, at least one bearing member attached to the sidewall and in movable engagement with the inner surface of the housing, and an interior compartment for accommodating the substrates which is collectively defined by the sidewall and the first and second end plates;

a vapor inlet port disposed within the tumbler and communicating with the interior compartment; and a vapor outlet port disposed within the tumbler and communicating with the interior compartment;

the bearing member facilitating the rotatable mounting of the tumbler within the containment vessel, with the removable attachment of the second end wall to the housing allowing the tumbler to be inserted into and removed from within the containment vessel and the rotation of the tumbler facilitating the reciprocal movement of the substrates positioned within the interior compartment between the first and second ends of the tumbler.

16. The deposition chamber of claim 15 wherein the sidewall has a generally cylindrical configuration.

17. The deposition chamber of claim 15 wherein the vapor inlet port is disposed within the first end plate and the vapor outlet port is disposed within the second end plate.

18. The deposition chamber of claim 15 wherein the housing has a generally cylindrical configuration.

19. The deposition chamber of claim 15 wherein the tumbler comprises a pair of bearing members attached to respective ends of the sidewall.

20. The deposition chamber of claim 19 wherein the first and second end plates are removably attached to respective ones of the bearing members for facilitating the loading and unloading of the interior compartment with the substrates.

21. The deposition chamber of claim 15 further in combination with:

a vapor inlet line extending through and rotatable within the first end wall, the vapor inlet line being inserted into the vapor inlet port and communicating with the interior compartment;

a vapor outlet line fluidly connected to the housing and communicating with the vapor outlet port; and a motor mechanically coupled to the tumbler;

the rotation of the tumbler via the motor facilitating the reciprocal movement of the substrates within the interior compartment.

22. The deposition chamber of claim 21 wherein the motor is adapted to rotate the tumbler at a speed in the range of approximately 1 to 50 RPM's.

23. The deposition chamber of claim 21 wherein the bearing member includes at least one opening disposed therein for facilitating the flow of vapors from the vapor outlet port into the vapor outlet line.

* * * * *